METHOD OF MAKING A JUNCTION TYPE FIELD EFFECT TRANSISTOR

Filed March 6, 1970 2 Sheets-Sheet 1

INVENTOR

KAZUO KOBAYASHI

BY Craig, Antonelli, Stewart & Hill

ATTORNEYS

INVENTOR

KAZUO KOBAYASHI

BY

Craig, Antonelli, Stewart & Hill

ATTORNEYS

United States Patent Office 3,649,385
Patented Mar. 14, 1972

3,649,385

METHOD OF MAKING A JUNCTION TYPE FIELD EFFECT TRANSISTOR

Kazuo Kobayashi, Tokyo, Japan, assignor to Hitachi, Ltd., Tokyo, Japan

Filed Mar. 6, 1970, Ser. No. 17,076
Claims priority, application Japan, Mar. 12, 1969, 44/18,322
Int. Cl. H01l 7/44
U.S. Cl. 148—186 1 Claim

ABSTRACT OF THE DISCLOSURE

A method of making a diffused junction type field effect transistor, wherein an annular P type gate region having a protruding portion connected to a P type silicon substrate across an N type source region is preliminarily formed, and after measuring the electrical characteristics between the source and a drain region, the protruding portion is heavily doped with an N type determining impurity so as to isolate the annular P type gate region and the substrate.

BACKGROUND OF THE INVENTION

Field of the invention

This invention relates to a method of making a semiconductor device, more particularly to a junction type field effect transistor.

DESCRIPTION OF THE PRIOR ART

As is well known, there are two kinds of field effect transistors, namely MOS (metal oxide semiconductor) type and junction type. In a junction type field effect transistor, a gate semiconductor region is formed adjacent to a carrier path made of a semiconductor with a PN junction therebetween. According to the conventional method of making a junction type field effect transistor, a problem arises in measuring the electrical characteristics of the field effect transistor, as will be described later in more detail with reference to the drawing.

SUMMARY OF THE INVENTION

An object of the invention is to provide an improvement in the manufacture of a semiconductor device having a good electrical characteristic, and especially in a mass production of junction type field effect transistors for high frequency use.

According to an embodiment of the invention, a junction type field effect semiconductor device is made by the following steps. First, in the surface of a semiconductor substrate of a first conductivity type, a second conductivity type region is formed by the selective diffusion. Then, an annularly diffused first conductivity type region with less depth is formed in the second conductivity type region. Thus, a carrier path, namely a portion to work as a channel region, is formed between the diffused first conductivity type region and the first conductivity type substrate. Portions to work as a drain and a source region are formed inside and outside the annularly diffused first conductivity type region. In this instance, the diffused first conductivity type region has a protruding portion reaching the substrate across the diffused second conductivity type region, thereby to keep the potential of the first conductivity type region the same as that of the substrate. For such an intermediate article, the electrical properties between the source and drain regions, such as the output characteristics, are measured. Since the first conductivity type region, i.e. the gate region, is connected to the substrate by the protruding portion, its potential does not fluctuate to effectively carry out the measurements. Then, for the purpose of obtaining a good high frequency characteristic, the second conductivity type impurity is selectively diffused into the protruding portion, located in the second conductivity type region (source region) and connecting the substrate and gate regions, of the diffused first conductivity type region to convert the portion into the second conductivity type. Thus, the annularly diffused first conductivity type (gate region) is electrically isolated from the first conductivity type substrate. Here, a second conductivity type impurity may also be introduced into those portions where the source and drain electrodes will be applied, so as to obtain good ohmic contacts.

Other objects and features of the invention will become more apparent by reference to the following detailed description, a specific embodiment taken in conjunction with the accompanied drawings.

DESCRIPTION OF THE PREFERRED EMBODIMENT

First, a conventional example will be described to help with an understanding of the invention.

Figure 1A:
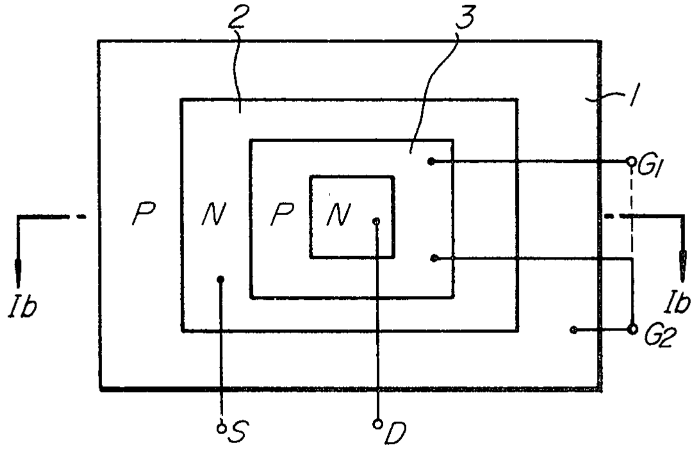
FIG. 1a PRIOR ART
FIG. 1*a* is a plane view of an isolated gate type field effect transistor according to the conventional method in a step of measuring its characteristics.
Figure 1B:
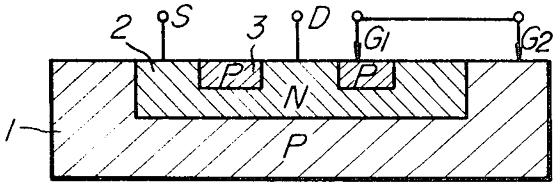
FIG. 1b PRIOR ART
FIG. 1*b* is a cross section of the semiconductor body shown in FIG. 1*a* along the line I*b*—I*b*.

An isolated gate type field effect transistor, as theoretically shown in FIGS. 1*a* and 1*b*, may be formed by the conventional method wherein, for example, a diffused N type region 2 is formed in a semiconductor substrate 1 and an annular region 3 to work as a gate $G_1$ which separate the source S and drain D in the surface portion is formed by the diffusion of P type impurities into the N type region 2. The annular region 3 surrounding the drain D and surrounded by the source S is isolated from the substrate 1 (another gate $G_2$). This isolation of the gate $G_1$ and substrate $G_2$ is to minimize the electrostatic capacitance of a portion working as a channel layer under the PN junction of the region 3.

Figure 2:
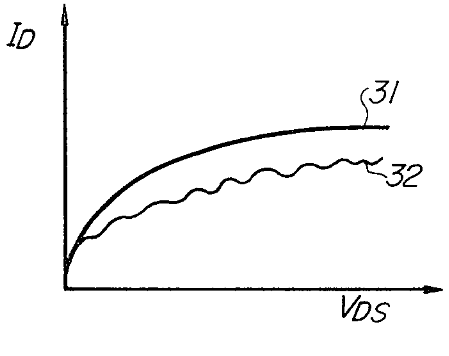
FIG. 2 shows the characteristics curves of the drain current $I_D$ versus drain-source voltage $V_{DS}$ of the devices according to the conventional method and according to the invention.

In the manufacture of a field effect transistor, it is effective to carry out the characteristics inspection (characteristics test of the current versus voltage between the source S and drain D) on an element provided with the diffused gate region 3 and to control the characteristics by another diffusion treatment according to the test results. If the potential of the gate $G_1$ is floating in this inspection, an accurate measurement of the characteristics cannot be expected. Thus, it is necessary to keep the potentials of the gate $G_1$ and substrate $G_2$ constant to measure the characteristics accurately. Since the gate $G_1$ has a very small surface area, however, it is difficult to place a probe accurately on this area. When the characteristics of a field effect transistor by the conventional method are measured, therefore, only the unstable values are obtained as shown by the curve 32 in FIG. 2.

This invention intends to eliminate the above drawback. The manufacturing process according to the invention is explained in the following with reference to an embodiment.

Figure 3:
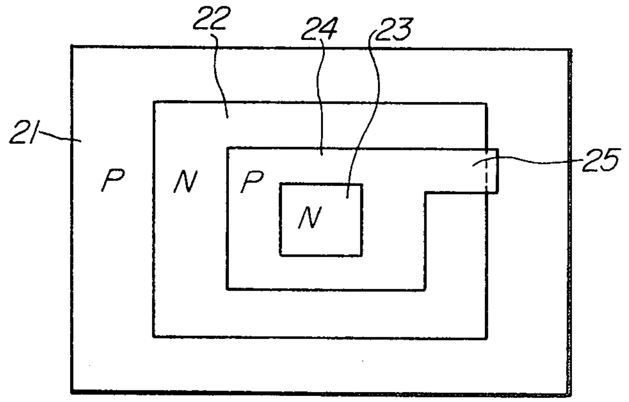
FIG. 3 is a plane view of an isolated gate type field effect transistor in a step of the manufacturing process according to the invention.

As shown in FIG. 3, an N type region 22 having a depth of 2 to 3$\mu$ and a surface impurity concentration of about $10^{16}$ to $10^{17}$ atoms/cc. is formed by the diffusion of a donor impurity such as antimony or phosphorus into a P type semiconductor substrate 21. Then, an annular gate region 24 having a depth of about 1$\mu$ and a surface impurity concentration of $10^{19}$ to $10^{20}$ atoms/cc. is formed by doping boron into the N type region 22. A protruding portion 25 across the region 22 is formed with the gate region 24 thereby to connect the gate region 24 to the surrounding substrate 21. The region 22 outside the gate region 24 works as a source region and the region 23 inside the gate region 24 as a drain region. Since the gate region 24 and substrate 21 is now electrically connected to each other, the gate potential can be easily maintained constant by contacting a probe on the substrate 21 for the inspection of the voltage between the source and drain versus current characteristics. As shown by the curve 31 in FIG. 2, a stable curve is obtained since the substrate 21 has a relatively large surface area to maintain the contact of the probe. Depending on the test result, the characteristics of a semiconductor body is adjusted by another diffusion treatment. Such diffusion treatment may be simultaneously performed with the following diffusion of an N+ impurity.

Figure 4A:
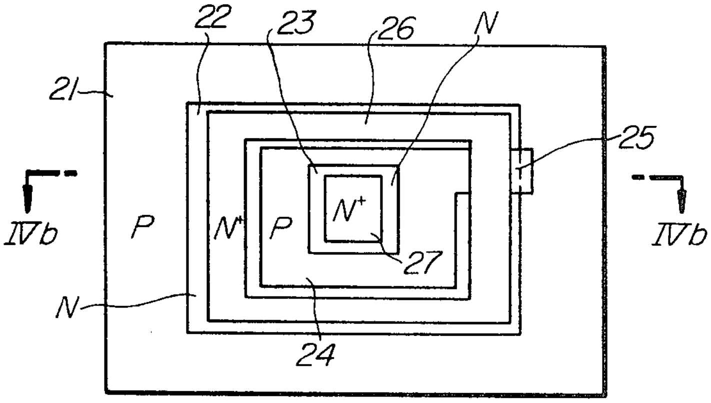
FIG. 4*a* is a plane view of an isolated gate type field effect transistor in a further step of the manufacturing process according to the invention.

As shown in FIG. 4*a*, heavily doped N type regions 26 and 27 having a depth of about 2$\mu$ and a surface impurity concentration of about $10^{21}$ atoms/cc. are formed by the diffusion of phosphorus into the N type regions 22 and 23. By this diffusion treatment, at least a part of the portion 25 protruding from the P type annular region 24 is now converted into an N type, insulating the P type region 24 and substrate 21. A completed article of a field effect transistor has the gates $G_1$ and $G_2$ isolated from each other. Here, it is necessary to select the depth and impurity concentration of the region 26 so as to surely cut off the interconnecting region 25 of the annular region 24 and substrate 21.

Figure 4B:
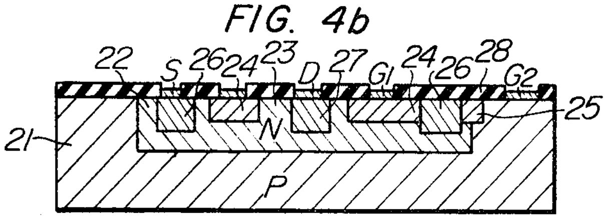
FIG. 4*b* is a cross section along the line IV*b*—IV*b* of FIG 4*a*.

Finally, as shown in FIG. 4*b*, a gate electrode $G_1$, source electrode S, drain electrode D and another gate electrode $G_2$ are applied respectively to the region 24, heavily doped N type regions 26 and 27 in the region 22 separated by the P type region 24, and substrate 21. When the source and drain electrodes are applied, the contact resistance is decreased by the heavily doped regions 26 and 27 formed in the source and drain regions 22 and 23. Further, an insulating film 28 of, such as silicon oxide or nitride, on the semiconductor surface, and the gate electrode $G_1$ is lead out onto the insulating film 28 and connected to a lead wire thereat.

As described above, according to the invention, the characteristics inspection is performed in a condition that the potentials of the gate and substrate are maintained the same by a temporary connection of the gate region and substrate. Thereafter, the gate region and substrate are insulated from each other by the formation of heavily doped regions in the source and drain regions. Therefore, a suitable intermediate inspection may be performed without any disturbance to the function of the element.

Further, a gate in general is not so highly reversely biased with respect to the source as with respect to the drain, and therefore, the introduction of an impurity into the interconnecting portion of the gate region and substrate does not cause any problem in the practical use of a field effect transistor. Also, the reverse breakdown voltage between the gate and drain is not at least affected in a device manufactured by the method according to the invention.

What is claimed is:

1. A method of making a junction type field effect semiconductor device comprising the steps of:

(a) forming, in a principal surface of a first conductivity type semiconductor substrate having at least one principal surface, a second conductivity type region having a predetermined depth;

(b) forming, in said second conductivity type region, an annular first conductivity type region having a protruding portion connected to said substrate;

(c) allowing an electric current to flow through said second conductivity type region intervening the substrate and the annular first conductivity type region while giving a predetermined potential to said substrate;

(d) introducing a second conductivity type determining impurity into said portion bridging the annular first conductivity type region and the semiconductor substrate so that the second conductivity type region thus obtained electrically insulates said annular first conductivity type region from said substrate; and (e) forming a first, a second and a third electrode on the surfaces of said second conductivity type region intervening said substrate and said annular first conductivity type region, said annular first conductivity type region, and a portion of the second conductivity type region surrounded by said annular first conductvity type region, respectively.

References Cited

UNITED STATES PATENTS 3,363,152 1/1968 Lin ............... 317—235

L. DEWAYNE RUTLEDGE, Primary Examiner

J. M. DAVIS, Assistant Examiner

U.S. Cl. X.R.

29—574; 317—235 A